United States Patent [19]

Ishibashi

[11] Patent Number: 5,208,480
[45] Date of Patent: May 4, 1993

[54] DYNAMIC LATCH CIRCUIT

[75] Inventor: Takashi Ishibashi, Tokyo, Japan

[73] Assignee: NEC Corporation, Tokyo, Japan

[21] Appl. No.: 751,331

[22] Filed: Aug. 28, 1991

[30] Foreign Application Priority Data

Aug. 29, 1990 [JP] Japan .................................. 2-227712

[51] Int. Cl.[5] ..................... H01L 23/48; H01L 29/46; H01L 29/54
[52] U.S. Cl. ................................. 257/503; 257/508; 257/736; 257/776
[58] Field of Search .............................. 357/71, 68, 45; 307/452, 453, 481; 377/79; 365/230.08

[56] References Cited

U.S. PATENT DOCUMENTS

| 4,814,841 | 3/1989 | Masuoka et al. | 357/71 |
| 4,857,987 | 8/1989 | Ognda et al. | 357/71 |
| 4,974,049 | 11/1990 | Sneda et al. | 357/71 |
| 5,045,725 | 9/1991 | Sasaki et al. | 357/45 |
| 5,063,433 | 11/1991 | Matsuo et al. | 357/71 |

Primary Examiner—Andrew J. James
Assistant Examiner—Ngan Van Ngo
Attorney, Agent, or Firm—Laff, Whitesel, Conte & Saret

[57] ABSTRACT

A dynamic latch circuit which is fabricated in a semiconductor integrated circuit comprises a first circuit such as a clocked inverter and a second circuit such as an inverter. The first and second circuits are connected by a holding line. In the semiconductor integrated circuit, at least three interconnection layers are provided on a semiconductor substrate to be insulated by insulating layers, such that the holding line is provided as the secondly highest interconnection layer, and an output line of the second circuit is provided as the uppermost interconnection layer to be positioned on the straight upper side of the holding line. For this structure, a coupling capacitance which is formed between the holding line and a through line connected to a third circuit and provided as the uppermost interconnection layer is decreased.

4 Claims, 6 Drawing Sheets

1

DYNAMIC LATCH CIRCUIT

FIELD OF THE INVENTION

This invention relates to a dynamic latch circuit of a semiconductor integrated circuit, and more particularly to, a dynamic latch circuit having a multilayer structure of more than three interconnection layers.

BACKGROUND OF THE INVENTION

A dynamic latch circuit of a semiconductor integrated circuit generally consists of a clocked inverter and an inverter, or a transfer gate and an inverter.

A first conventional dynamic latch circuits is composed of a clocked inverter and an inverter connected through a holding line to the clocked inverter. In this conventional dynamic latch circuit, when an input signal is supplied to the clocked inverter, the input signal is inverted based on the timing of a clock signal applied to the clocked inverter, so that the inverted signal is supplied on the holding line to be connected to the inverter. Thus, an output signal which is obtained by inverting the inverted signal is generated on an output line of the inverter.

This conventional dynamic latch circuit has an integrated circuit structure, such that an input line for the input signal, a clock line fore the clock signal and a part of the holding line which is an input line of the inverter are provided as a first interconnection layer on a semiconductor substrate, the other part of the holding line which is an output line of the clocked inverter and a part of the output line of the inverter are provided as a second interconnection layer which is insulated from the first interconnection layer by an insulating layer, and the other part of the output line of the inverter is provided as a third interconnection layer which is insulated from the second interconnection layer by an insulating layer.

A second conventional dynamic latch circuit includes a through line in addition to the structure of the first conventional dynamic latch circuit. The through line is assumed to be formed as the third interconnection layer which is positioned above the second interconnection layer. The through line is connected with other circuits, and operates independently with the latch circuit. Therefore, interfaces of each insulating layer can be used efficiently to increase an integration degree.

According to the second conventional dynamic latch circuit, however, there is a disadvantage in that the holding line is affected by a coupling capacitance with the through line, so that a malfunction occurs by a crosstalk between the holding line and the through line.

SUMMARY OF THE INVENTION

Accordingly, it is an object of the invention to provide a dynamic latch circuit in which a malfunction does not occur by a crosstalk between a holding line and a through line.

According to the invention, a dynamic latch circuit comprises:

at least first and second circuit having predetermined functions and connected by a holding line, the first circuit having an input line and the second circuit having an output line;

wherein the holding line, and the input and output lines are of at least three interconnection layers which are provided on a semiconductor substrate to be insulated by insulating layers grown thereon, the output line being provided as an uppermost interconnection layer, and the holding line being provided as a secondly highest interconnection layer, such that the output line is positioned on a straight upper side of the holding line.

BRIEF DESCRIPTION OF THE DRAWINGS

The invention will be explained in more detail in conjunction with appended drawings; wherein.

DESCRIPTION OF THE PREFERRED EMBODIMENTS

Before describing a dynamic latch circuit according to the invention, the conventional dynamic latch circuits briefly described before will be explained in conjunction with FIGS. 1A, 1B and 2 to 5.

Figure 1A:
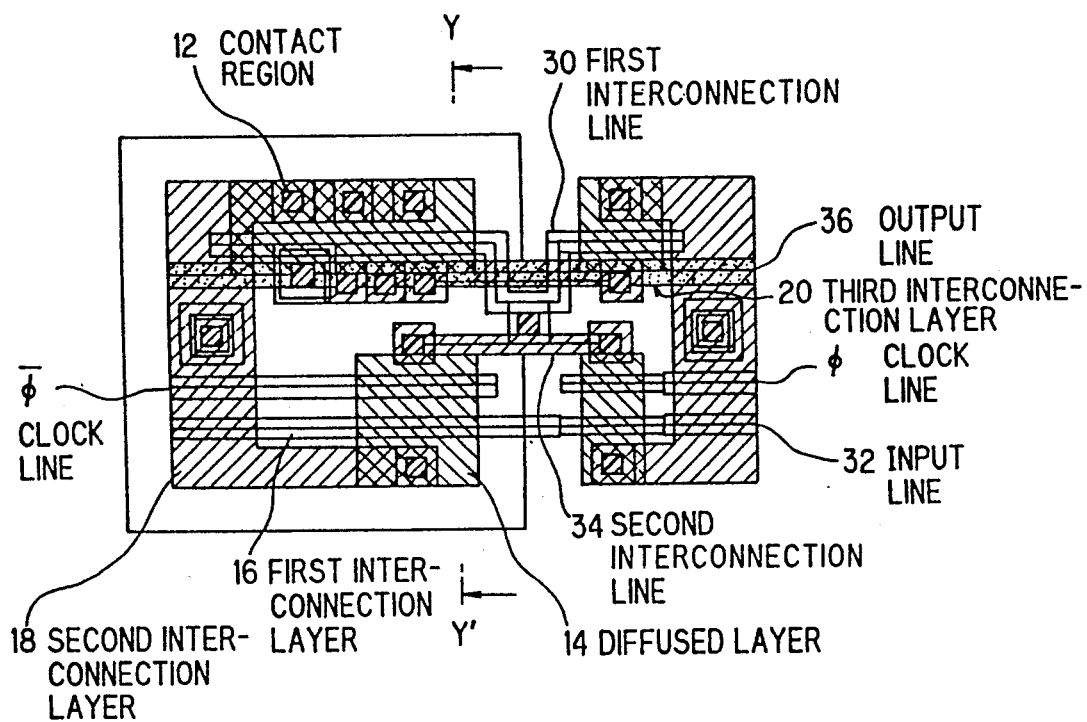
FIG. 1A is a plan view showing a first conventional dynamic latch circuit.
Figure 1B:
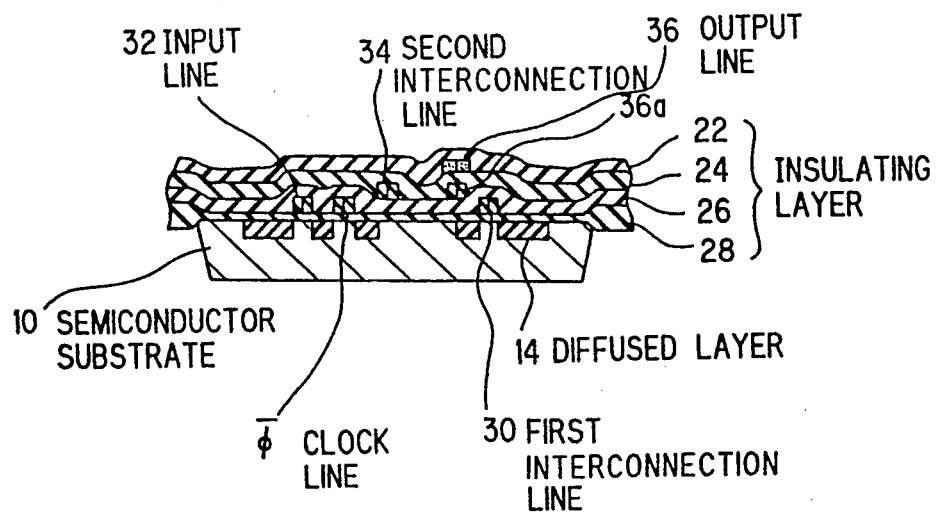
FIG. 1B is a sectional view taken on line Y—Y' of FIG. 1A.

In FIGS. 1A and 1B, a first conventional dynamic latch circuit includes a semiconductor substrate 10 having a diffused layer 14 formed thereon, first to third interconnection layers 16, 18 and 20 formed on the semiconductor substrate 10, and insulating layers 22, 24, 26 and 28 by which the interconnection layers 16, 18 and 20 are insulated, respectively. The first to third interconnection layers 16, 18 and 20 are connected with a plurality of contact regions 12, respectively. The first interconnection layer 16 includes a first interconnection line 30 which is an input line of an inverter, an input line 32 of the dynamic latch circuit, and clock lines $\phi$ and $\bar{\phi}$ each supplying a clock pulse to a clocked inverter. The second interconnection layer 18 includes a second interconnection line 34 which is an output line of the clocked inverter. The second interconnection line 34 is designed to be as short as possible to decrease a coupling capacity with other interconnection lines. The third interconnection layer 20 includes an output line 36 of the latch circuit.

Figure 2:
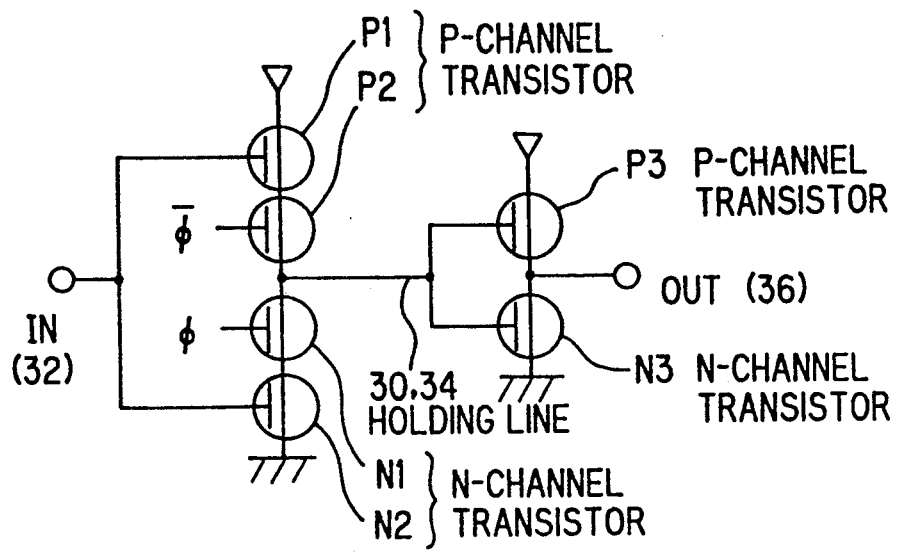
FIG. 2 is a equivalent circuit of the first conventional dynamic latch circuit.

FIG. 2 shows an equivalent circuit of the dynamic latch circuit shown in FIGS. 1A and 1B. The dynamic latch circuit includes a clocked inverter composed of two P-channel transistors P1 and P2 and two N-channel transistors N1 and N2 connected in series between a power supply and ground, respectively, and an inverter composed of a P-channel transistor P3 and an N-channel transistor N3 connected in series between a power supply and ground, respectively. In the clocked inverter, gates of the P-channel transistor P2 and the N-channel transistor N1 are connected with the clock lines $\phi$ and $\overline{\phi}$, respectively, and a common gate of the P-channel transistor P1 and the N-channel transistor N2 is connected with the input line IN(32). An output line of the clocked inverter (P1, P2, N1 and N2) is connected to a common gate of the P-channel transistor P3 and the N-channel transistor N3 through a holding line composed of the first and second interconnection lines 30 and 34, and an output line of the inverter (P3 and N3) is connected to the output line OUT(36).

Figure 3A:
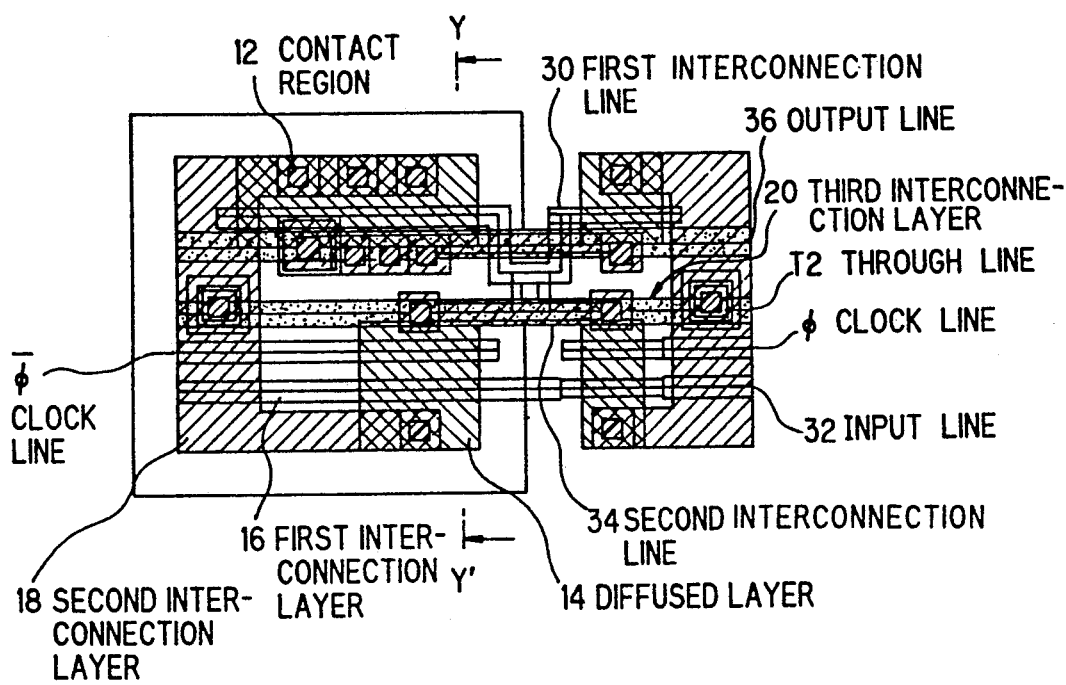
FIG. 3A is a plan view showing a second conventional dynamic latch circuit.
Figure 3B:
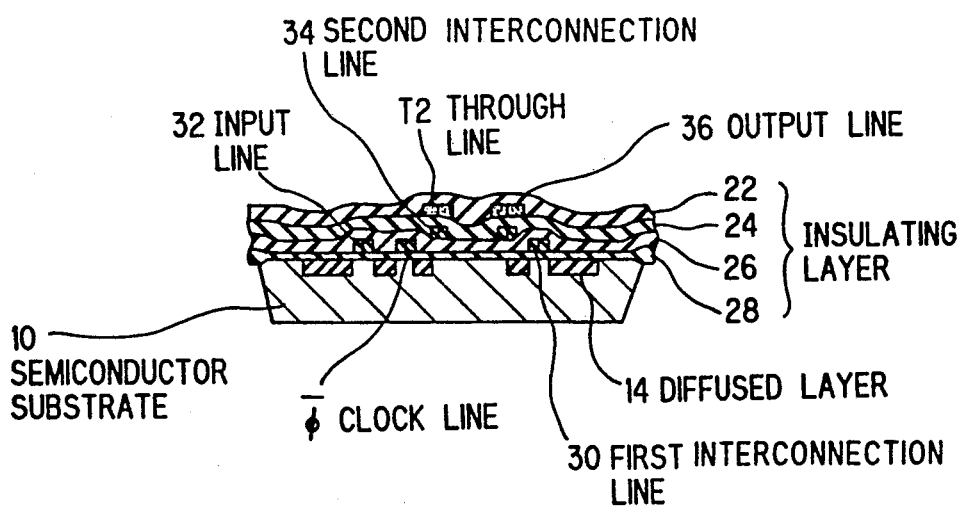
FIG. 3B is a sectional view taken on line Y—Y' of FIG. 3A.

Next, a second conventional dynamic latch circuit will be explained in conjunction with FIGS. 3A, 3B, 4 and 5. In FIGS. 3A and 3B, the dynamic latch circuit includes a semiconductor substrate 10 having a diffused layer 14 formed thereon, first to third interconnection layers 16, 18 and 20 formed on the semiconductor substrate 10, and insulating layers 22 to 28 which are sandwiched among the interconnection layer s 16 to 20, respectively. The first to third interconnection layer s 16 to 20 are connected with a plurality of contact regions 12, respectively. The first interconnection layer 16 includes a first interconnection line 30 which is an input line of an inverter, an output line 32 of the dynamic latch circuit, and clock lines $\phi$ and $\overline{\phi}$ each supplying a clock pulse to a clocked inverter. The second interconnection layer 18 includes a second interconnection line 34 which is an output line of the clocked inverter. The second interconnection line 34 is designed to be as short as possible to decrease a coupling capacity with other interconnection lines. The third interconnection layer 20 includes an output line 36 of the latch circuit and a through line T2 positioned above the second interconnection line 34.

Figure 4:
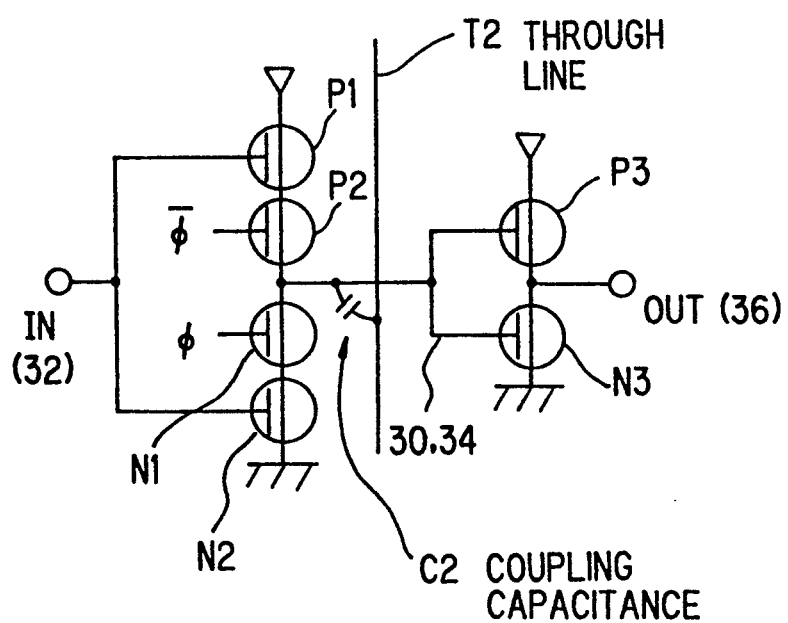
FIG. 4 is a equivalent circuit of the second conventional dynamic latch circuit.

FIG. 4 shows an equivalent circuit of the second conventional dynamic latch circuit shown in FIGS. 3A and 3B. The dynamic latch circuit includes a clocked inverter composed of two P-channel transistors P1 and P2 and two N-channel transistors N1 and N2 connected in series between a power supply and grounds, respectively, and an inverter composed of a P-channel transistor P3 and an N-channel transistor N3 connected in series between a power supply and ground, respectively. In the clocked inverter, gates of the p-channel transistor P2 and the N-channel transistor N1 are connected with the clock lines $\phi$ and $\overline{\phi}$, respectively, and a common gate of the P-channel transistor P1 and the N-channel transistor N2 is connected with the input line IN(32). An output line of the clocked inverter (P1, P2, N1 and N2) is connected to a common gate of the P-channel transistor P3 and the N-channel transistor N3 through a holding line composed of the first and second interconnection lines 30 and 34, and an output line of the inverter (P3 and N3) is connected to the output line OUT(36). A coupling capacitance C2 is formed between the second interconnection line 34 and the through line T2.

Figure 5:
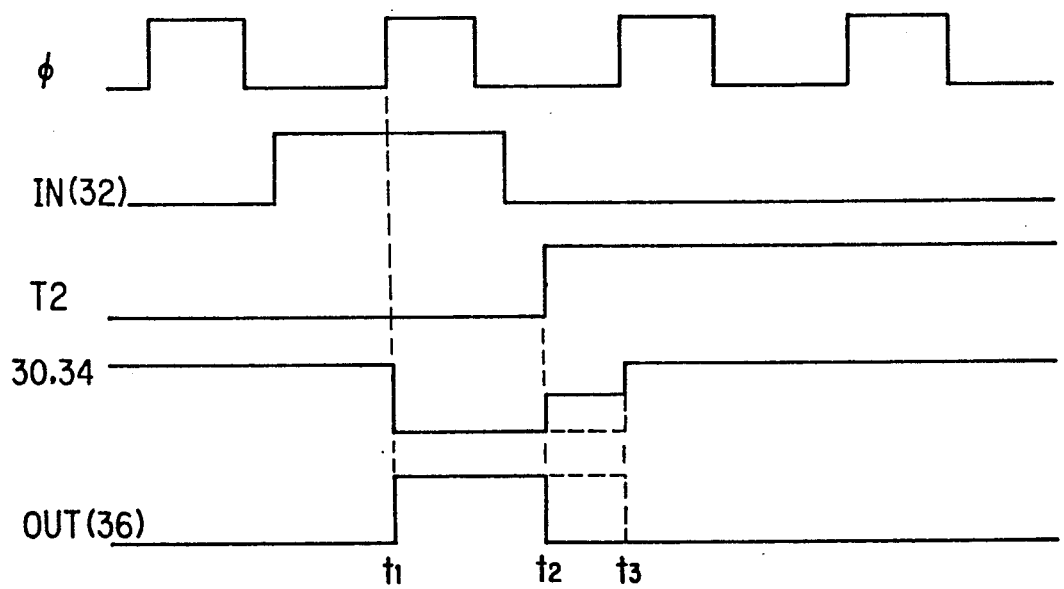
FIG. 5 is a timing chart showing operation of the second conventional dynamic latch circuit.

In the second conventional semiconductor integrated circuit, when a level of the clock line $\phi$ becomes high from low at the time $t_1$ under a state that level of the input line 32 is high, a level of the holding line (30 and 34) becomes low from high, as shown in FIG. 5. This signal level is maintained on the holding line. Next, when a level of the through line T2 becomes high from low at the time $t_2$ under a state that a level of the clock line $\phi$ is low, a level of the holding line (30 and 34) rises up by the coupling capacity C2. Then, if the level of the holding line (30 and 34) rises over a threshold level of the N-channel transistor N3, a malfunction is occurred in the latch circuit. That is, a level of the output line 36 becomes a low from high at the time $t_2$, nevertheless the output level should be kept high until a level of the clock line $\phi$ becomes high at the time $t_3$ as shown by a dashed line in FIG. 5.

Figure 6A:
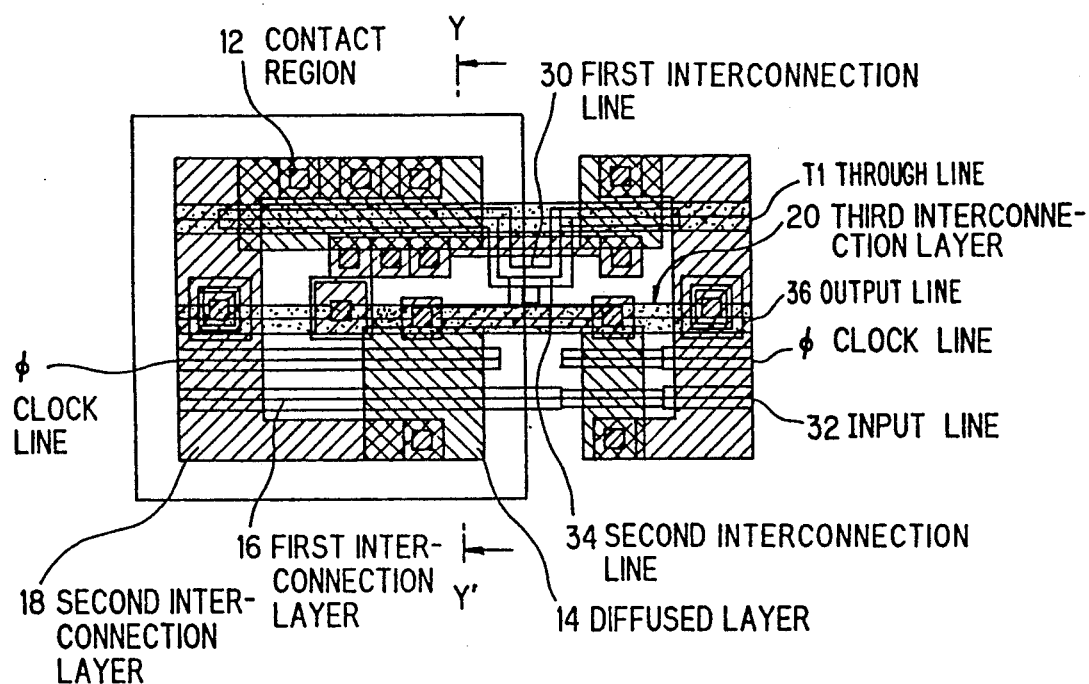
FIG. 6A is a plan view showing a dynamic latch circuit of a preferred embodiment according to the invention.
Figure 6B:
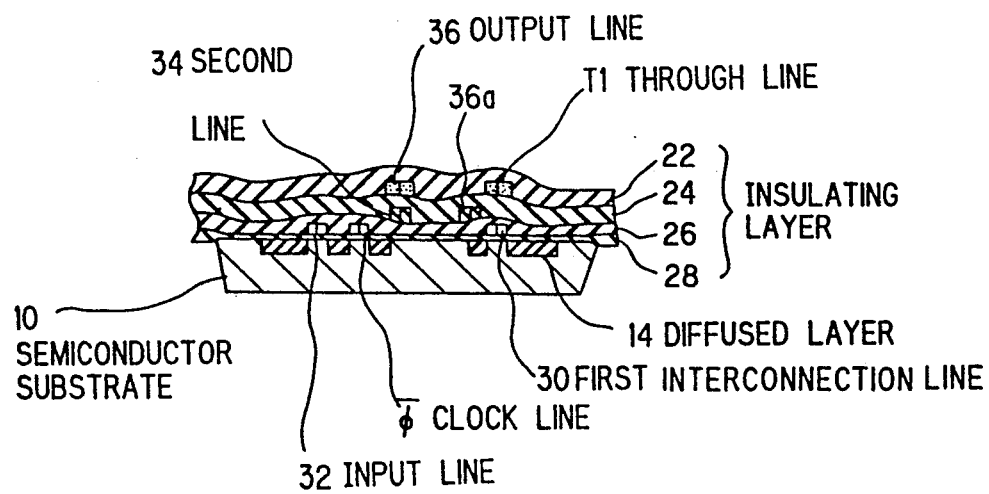
FIG. 6B is a sectional view taken on line Y—Y' of FIG. 6A.

Next, a dynamic latch circuit of a preferred embodiment according to the invention will be explained in conjunction with FIGS. 6A, 6B, 7 and 8. In FIGS. 6A and 6B, a dynamic latch circuit includes a semiconductor substrate 10 having a diffused layer 14 formed thereon, first to third interconnection layers 16, 18 and 20 formed on the semiconductor substrate 10, and insulating layers 22, 24, 26 and 28 by which interconnection layers 16, 18 and 20 , respectively. The first to third interconnection layers 16 to 20 are connected with a plurality of contact regions 12, respectively. The first interconnection layer 16 includes a first interconnection line 30 which is a part of an input line of an inverter, an input line 32 of the dynamic latch circuit, and clock lines $\phi$ and $\overline{\phi}$ each supplying a clock pulse to a clocked inverter. The second interconnection layer 18 includes a second interconnection line 34 which is a part of an output line of the clocked inverter. The second interconnection line 34 is designed to be as short as possible to decrease a coupling capacity with other interconnection lines. The third interconnection layer 20 includes an output line 36 of the latch circuit positioned above the second interconnection line 34 and a through line T1 positioned above the first interconnection line 30.

Figure 7:
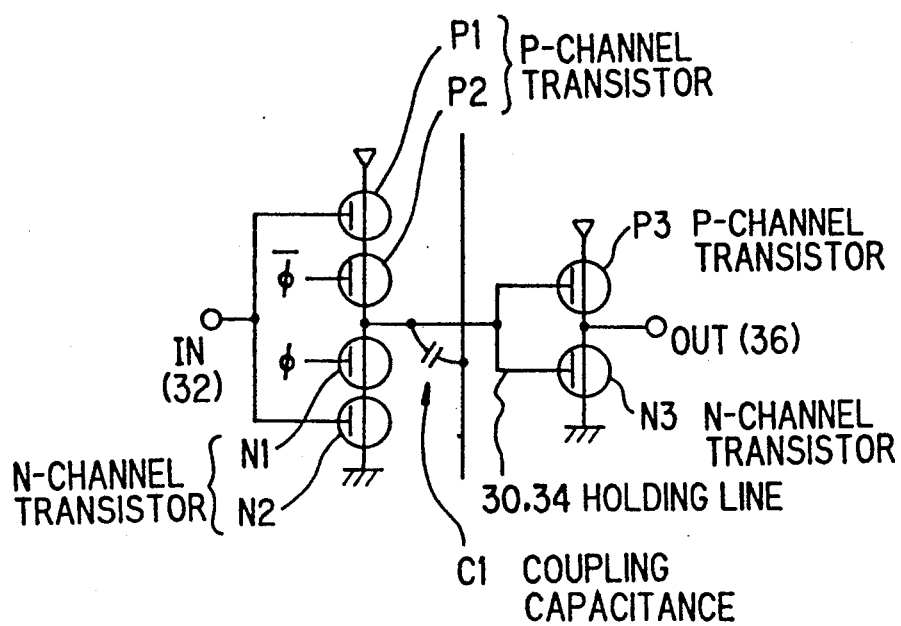
FIG. 7 is a equivalent circuit of the preferred embodiment.

FIG. 7 shows an equivalent circuit of the dynamic latch circuit according to the preferred embodiment shown in FIGS. 6A and 6B. The dynamic latch circuit includes a clocked inverter composed of two P-channel transistors P1 and P2 and two N-channel transistors N1 and N2 connected in series between a power supply and ground, respectively, and an inverter composed of a P-channel transistor P3 and an N-channel transistor N3 connected in series between a power supply and ground, respectively. In the clocked inverter, gates of the P-channel transistor P2 and the N-channel transistor N1 are connected with the clock lines $\phi$ and $\overline{\phi}$, respectively, and a common gate of the P-channel transistor P1 and the N-channel transistor N2 is connected with the input line IN(32). An output line of the clocked inventer (P1, P2, N1 and N2) is connected to a common gate of the P-channel transistor P3 and the N-channel transistor N3 through a holding line composed of the first and second interconnection lines 30 and 34, and an output line of the inverter (P3 and N3) is connected to the output line OUT(36). In this structure, a coupling capacitance C1 which is formed between the second interconnection line 34 and the through line T1 can be decreased to a negligible value, because the through line T1 is provided at a predetermined position, from which the second interconnection line 34, that is the holding line is apart to negate the coupling capacitance C1 substantially.

In operation, when a level of the clock line $\phi$ becomes high from low at the time $t_1$ under a state that a level of the input line 32 is high, a level of the holding line (30 and 34) becomes low from high and a high output signal is obtained, as shown in FIG. 7. After that, when a level of the clock line $\phi$ becomes high from low at the time $t_2$ under a state that a level of the input line IN(32) is low, a level of the holding line (30 and 34) becomes high from low. Thus, a level of the output line OUT(36) becomes low from high in response to a correct change of the holding line (30 and 34).

Figure 8:
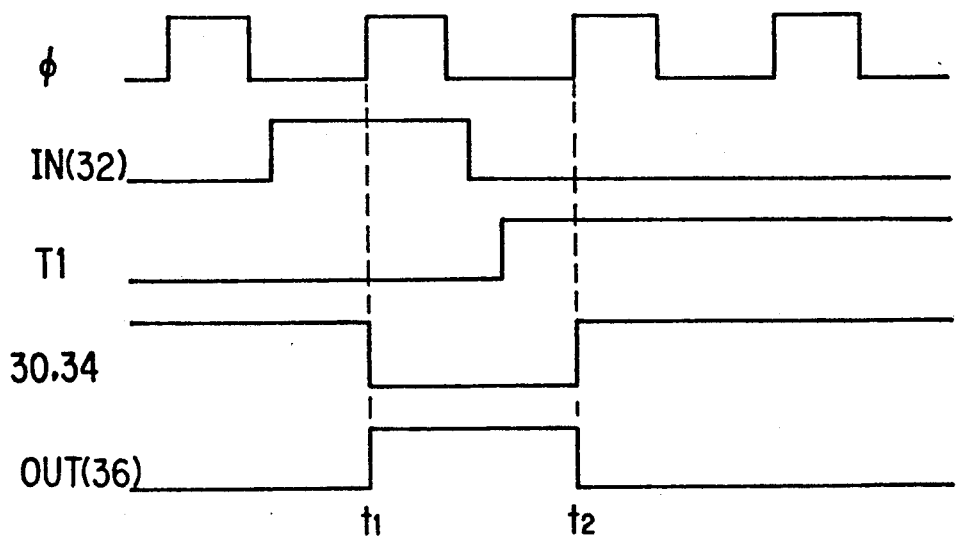
FIG. 8 is a timing chart showing operation of the preferred embodiment.

As described above, according to the preferred embodiment, the first interconnection line 30 is positioned through the insulating layer 24 on the lower side of the through line T1, and the second interconnection line 34 positioned with a sufficient distance the through line T1. Then, the coupling capacitance C1 is sufficiently small. Therefore, the holding line (30 and 34) is not affected by the coupling capacitance C1, so that the latch circuit always operates correctly, as shown in FIG. 8.

Although the invention has been described with respect to the specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A dynamic latch circuit, comprising:
   at least first and second circuits having predetermined functions and connected by a holding line, said first circuit having an input line and said second circuit having an output line;
   wherein said holding line, and said input and output lines are of at least three interconnection layers which are provided on a semiconductor substrate to be insulated by insulating layers grown thereon, said output line being provided as an uppermost interconnection layer, and said holding line being provided as a secondly highest interconnection layer, such that said output line is positioned on a straight upper side of said holding line.

2. A dynamic latch circuit, according to claim 1, further comprising a through line connected to a third circuit having a predetermined function;
   wherein said through line are provided as said uppermost interconnection layer to have a predetermined distance from said holding line to decrease a coupling capacitance therebetween.

3. A dynamic latch circuit, according to claim 2, said first circuit is a clocked inverter; and
   said second circuit is an inverter;
   wherein an input line and clock line of said clocked inverter is provided as a lowermost interconnection layer.

4. A dynamic latch circuit, according to claim 3, said holding line is provided as said secondly highest and lowermost interconnection layers which are connected by a contact hole.

* * * * *